US007020832B2

(12) United States Patent
Jeon et al.

(10) Patent No.: US 7,020,832 B2
(45) Date of Patent: Mar. 28, 2006

(54) TURBO DECODER AND ITS CALCULATION METHODS HAVING A STATE METRIC

(75) Inventors: In San Jeon, Taejon (KR); Hyuk Kim, Taejon (KR); Woo Seok Yang, Jeju-Do (KR); Kyung Soo Kim, Taejon (KR); Whan Woo Kim, Taejon (KR); Han Jin Cho, Taejon (KR)

(73) Assignee: Electronics and Telecommunications Research Institute, (KR)

( * ) Notice: Subject to any disclaimer, the term of this patent is extended or adjusted under 35 U.S.C. 154(b) by 488 days.

(21) Appl. No.: 10/039,005

(22) Filed: Dec. 31, 2001

(65) Prior Publication Data

US 2003/0101403 A1 May 29, 2003

(30) Foreign Application Priority Data

Nov. 19, 2001 (KR) ............................... 2001-71757

(51) Int. Cl.
*H03M 13/03* (2006.01)
(52) U.S. Cl. ...................... 714/796; 714/795; 714/791; 714/794
(58) Field of Classification Search ................ 714/755, 714/796, 786, 795, 791
See application file for complete search history.

(56) References Cited

U.S. PATENT DOCUMENTS 6,343,368 B1 * 1/2002 Lerzer ........................ 714/796

6,381,728 B1 * 4/2002 Kang ......................... 714/781
6,434,203 B1 * 8/2002 Halter ........................ 375/341
6,658,071 B1 * 12/2003 Cheng ........................ 375/348

OTHER PUBLICATIONS

"Implementation and Performance of a Serial MAP Decoder for use in Iterative Turbo Decoder", S. Pictrobon, Satellite Communications Research Centre, Univ of S. Australia, 1 page.

* cited by examiner

*Primary Examiner*—Albert Decady
*Assistant Examiner*—Esaw Abraham
(74) *Attorney, Agent, or Firm*—Blakely Sokoloff Taylor & Zafman (57) ABSTRACT

The present invention relates to a turbo decoder having a state metric, a calculating method using the turbo decoder and a computer-readable recoding medium for executing a calculation method implemented to the turbo decoder. The turbo decoder includes branch metric calculation unit, state metric calculation unit and log likelihood ratio calculation unit. The present invention may reduce calculation steps by simplifying a conventional turbo decode algorithm, reducing a size of a hardware, which the turbo decoder can be implemented in as an application specific integrated circuit (ASIC) or a field programmable gate array (FPGA). The present invention can be implemented in an error correction in wireless communication system and satellite communication system.

11 Claims, 7 Drawing Sheets

TURBO DECODER AND ITS CALCULATION METHODS HAVING A STATE METRIC

FIELD OF THE INVENTION

The present invention relates to a turbo decoder having a state metric, a calculation method using the state metric and a computer-readable recoding medium for executing a calculation method implemented in the turbo decoder; and, more particularly, to a turbo decoder having a state metric for calculating a reverse state metric, deriving a new forward state metric according to the calculated reverse state metric and simplifying a calculation of log likelihood ratio.

DESCRIPTION OF THE PRIOR ARTS

New error correction method using a turbo code is introduced in an article by Claude Berrou, "Near Shannon Limit Error-Correcting Coding and Decoding: Turbo Code, Proc", 1993, *IEEE Int. Conf. On Comm. Geneva, Switzerland*, pp. 1064–1070 (1993). According to the article, the error correction method improves a bit error rate in proportional to the number of applying the method and can correct an error to near a channel capacity by repeatedly applying the method. The channel capacity is described in detail in an article by C. E. Shannon, "A mathematical theory of communication", *Bell Sys. Tech. J.*, Vol27, pp.379–423, (July 1948), pp623–656, (October 1948).

In the article by Claude Berrou, a LogMAP algorithm is selected as a method for decoding the turbo code. A turbo decoder using a simplified LogMAP algorithm is introduced in an article by S. S. Pietrobon, "Implementation and Performance of a Serial MAP Decoder for use in an Iterative Turbo Decoder", *IEEE international Symposium on Information Therory*, September, pp471, (1995). A new simplified LogMAP algorithm is also introduced by S. S. Pietrobon, "Implementation and performance of a turbo/MAP decoder", *International Journal of Satellite Communications*, Vol6, Iss1, pp.23–46, (February, 1998).

In a meantime, a soft output viterbi algorithm (SOVA) can be used instead of a MAP decoder in a turbo decoder as a standard decoder. An enhanced SOVA used in a turbo decoding was introduced in an article by L. Lin, "Improvements in SOVA-base decoding for turbo codes", *IEEE int. Conf. On Communications*, Vol.3., pp1473–1478, June, 1997.

A maximum log MAP (MaxLogMAP) algorithm is another algorithm for decoding the turbo code and it is very similar to the MAP algorithm. An algorithm for reducing calculation steps by using the MaxLogMAP is recently introduced in an article by S. Crozier, et. Al. "Efficient Turbo Decoding Techniques", *International Conference on Wireless Communications, Wireless 99*, Calgary, Canada, (July 1999).

A turbo code has been selected for an error correction in a high-speed data communication system as a standard of 3GPP/3GPP2 in IMT-2000, which is the next generation model of the mobile communication system.

The turbo decoder can be implemented by using the MAP decoder or the SOVA decoder as a standard decoder, however, since the present invention only relates to the MAP decoder, a detailed description of the SOVA will be omitted. And detailed description of the MAP decoder will be also omitted in here since it is well described in articles by C. Berrou, "Near Shannon Limit Error-Correcting Coding and Decoding: Turbo Code, Proc", 1993, *IEEE Int. Conf. On Comm. Geneva, Switzerland*, pp. 1064–1070, (1993); and by S. S. Pietrobon, "A Simplification of the Modified Bahl Decoding Algorithm for Systematic Convolutional Codes", *Int. Symp. Inform. Theory & its Applic*, pp.1073–1077, (November 1994); and by S. S. Pietrobon, "Implementation and performance of a turbo/MAP decoder", *International Journal of Satellite Communications*, Vol6, Iss1, pp.23–46, (February, 1998).

Generally, a structure of the turbo decoder is described in the articles by Berrou, Pietrobon and Crozier and especially the article by Berrou is the first article introducing the turbo decoder.

According to above-mentioned articles, Pietrobon simplifies and improve the LogMAP algorithm and implements the improved LogMAP algorithm into the turbo decoder. Generally, the conventional turbo decoder is introduced by Pietrobon. Crozier introduces a structure of the MaxLog-MAP algorithm having a simplified calculation method of Log likelihood ratio (LLR).

The LogMAP, a SubLogMAP and the MaxLogMAP are an algorithm used in turbo decoding. Such the algorithms typically have three subalgorithms including a branch metric calculation, a state metric calculation and a Log likelihood ratio calculation. Additionally, the state metric calculation has a forward state metric calculation and a reverse state metric calculation as the subalgorithms.

An algorithm introduced by Pietrobon in an article, "Implementation and Performance of a Serial MAP Decoder for use in an Iterative Turbo Decoder", *IEEE international Symposium on Information Therory*, September, pp471, (1995) may have some defects. Although the algorithm also may have an advantage, which does not need to calculate the branch metric again and uses the pre-calculated the forward/reverse state metric in the Log Likelihood Ratio (LLR) calculation the algorithm to calculate every each states in case input is "0" and "1" in calculating a forward state metric and a reverse state metric.

Pietrobon introduces a new algorithm in 1998 and it also may have a disadvantage. Although the new algorithm does not need to calculate every each states in case input is "0" or "1" in calculating a forward state metric and a reverse state metric, however, the new algorithm should newly calculate the branch metric and employs the newly calculated branch metric with the forward/reverse state metric in the Log Likelihood Ratio (LLR) calculation.

SUMMARY OF THE INVENTION

It is, therefore, an object of the present invention to provide a turbo decoder having a simplified state metric for reducing calculation steps by simplifying a conventional turbo decode algorithm and reducing a size of a hardware, wherein the turbo decoder can be implemented in as an application specific integrated circuit (ASIC) or a field programmable gate array (FPGA).

It is another object of the present invention to provide a turbo code calculation method for effectively reducing calculation steps.

It is another object of the present invention to provide a computer-readable recording medium storing instructions for executing a compact calculation method implemented to the turbo decoder.

In accordance with an aspect of the present invention, there is provided an turbo decoder having a state metric, including: branch metric calculation unit for calculating a branch metric by receiving symbols through an input buffer; state metric calculation unit for calculating a reverse state metric by using the calculated branch metric at the branch metric calculating unit, storing the reverse state metric in a memory, calculating a forward state metric; and log likelihood ratio calculation unit for calculating a log likelihood ratio by receiving the forward state metric from the state metric calculation unit and reading the reverse state metric saved at a memory in the state metric calculation unit.

In accordance with an aspect of the present invention, there is also provided a calculation method implemented to the turbo decoder, comprising the steps of: calculating a branch metric by receiving symbols; calculating a reverse state metric in case an input i is 0 by using the calculated branch metric and saving the calculated reverse state metric in a memory; calculating a forward state metric in case an input i is 0 and the input i is 1 by using the calculated branch metric; calculating a log likelihood ratio by using the forward state metric and the reverse state metric; and storing the log likelihood ratio.

In accordance with an aspect of the present invention, there is also provided a computer-readable recording medium storing instructions for executing a calculation method implemented to the turbo decoder, comprising functions of: calculating a branch metric by receiving symbols; calculating a reverse state metric in case an input i is 0 by using the calculated branch metric and saving the calculated reverse state metric in a memory; calculating a forward state metric in case an input i is 0 and the input i is 1 by using the calculated branch metric; calculating a log likelihood ratio by using the forward state metric and the reverse state metric; and storing the log likelihood ratio.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Equations used in this document is same equations taught in the article by Pietrobon, "Implementation and performance of a turbo/MAP decoder", *International Journal of Satellite Communications*, Vol6, Iss1, pp.23–46, (February, 1998) which are helpful to more clearly understand the present invention.

For understanding the present invention, major equations of a conventional turbo decoder algorithm will be described as hereinbelow.

A turbo decoder algorithm used in an article by S. S. Pietrobon, "A Simplification of the Modified Bahl Decoding Algorithm for Systematic Convolutional Codes", *Int. Symp. Inform. Theory & its Applic*, pp.1073–1077, (November 1994) can be described as Eq. 1 to Eq. 4 by using equations defined in the article by Pietrobon 1998 as follows:

$$D_k^{i,m} = \frac{2}{\sigma^2}(x_k i + y_k Y_k^{i,m}) \quad \text{Eq. 1}$$

$$A_k^{i,m} = D_k^{i,m} + \underset{j=0}{\overset{1}{E}} A_{k-1}^{j,b(j,m)} \quad \text{Eq. 2}$$

$$B_k^{i,m} = \underset{j=0}{\overset{1}{E}}\left(B_{k+1}^{j,f(i,m)} + D_{k+1}^{j,f(i,m)}\right) \quad \text{Eq. 3}$$

$$L_k = \underset{m=0}{\overset{2^v-1}{E}}(A_k^{1,m} + B_k^{1,m}) - \underset{m=0}{\overset{2^v-1}{E}}(A_k^{0,m} + B_k^{0,m}) \quad \text{Eq. 4}$$

where k is a time, a sequence or a stage and is positive number with "0". i is an input of $k^{th}$ sequence and j is a $(k+1)^{th}$ input for a forward state metric or a $(k-1)^{th}$ input for a reverse state metric. The i and j are "0" or "1". m is a state of a trellis diagram and v is number of memory in a recursive systematic encoder. The m is positive integer including "0" and the v is positive integer. $\sigma^2$ denotes distribution of input symbols for an additive white gaussian noise (AWGN). $X_k$ is $k^{th}$ transmit information bit of the AWGN. $Y_k$ is $k^{th}$ transmit information bit of the AWGN. $Y_k^{i,m}$ is a generating code word for k, i, m. $D_k$ is $k^{th}$ metric. $A_k$ is a $k^{th}$ forward state metric. b(j,m) is a $(k-1)^{th}$ reverse state, which is related $k^{th}$ state between input j and state m. E is a function E defined as $$\underset{j=0}{\overset{1}{E}} A_k^j = A_k^0 E A_k^1 = \log_e\left(e^{A_k^0} + \underline{e^{A_k^1}}\right).$$

$B_k$ is a $k^{th}$ reverse state metric. f(i,m) is $(k+1)^{th}$ state related to $k_{th}$ state with input i and state m. $L_k$ is a log likelihood ratio.

The similar variables, which are used in above-mentioned equations, will be used every equations hereafter.

A turbo decoder introduced in an article by Pietrobon, "Implementation and performance of a turbo/MAP decoder", International Journal of Satellite Communications, Vol6, Iss1, pp.23–46, (February, 1998) can be expressed as Eqs. 5 to 8 and, for the sake of convenience, detailed description will be omitted here.

$$D_k^{i,m} = -Ax_k i - Ay_k c^{i,m} \quad \text{Eq. 5}$$

$$A_k^m = \underset{j=0}{\overset{1}{E}}\left(A_k^{b(j,m)} + D_{k-1}^{j,b(j,m)}\right) \quad \text{Eq. 6}$$

$$B_k^m = \underset{j=0}{\overset{1}{E}}\left(B_{k+1}^{f(j,m)} + D_k^{j,m}\right) \quad \text{Eq. 7}$$

-continued $$L_k = \sum_{m=0}^{2^v-1} \left(A_k^m + D_k^{0,m} + B_{k+1}^{f(0,m)}\right) - \sum_{m=0}^{2^v-1} \left(A_k^m + D_k^{1,m} + B_{k+1}^{f(1,m)}\right) \quad \text{Eq. 8}$$

where, variables in Eq. 5 to Eq. 8 are same as variables in Eq. 1 to Eq. 4. However, in a branch metric calculation, A for Calculating the branch metric is not the forward state metric and is a size of transmitted symbol, which is amplitude. Also, distribution values are represented by a term of c. Therefore, the branch metric in the article by Pietrobon, 1995 and the branch metric in the article by Pietrobon, 1998 have small difference but the equations are identical.

A reverse calculation algorithm effectively reducing calculation steps by modifying conventional reverse branch metric calculation method will be described as herein below.

Referring back to Eq. 3, $B_k^{i,m}$ is a reverse state metric value at $k^{th}$ stage of m state with an input i. f(i,m) means possible next states from a current state m according to input i.

The reverse state metric can be expressed as two following Eq. 9 and Eq. 10.

$$B_k^{0,m} = \ln[\exp[B_{k+1}^{0,f(0,m)} + D_{k+1}^{0,f(0,m)}] + \exp[B_{k+1}^{1,f(0,m)} + D_{k+1}^{1,f(0,m)}]] \quad \text{Eq. 9}$$

$$B_k^{1,m} = \ln[\exp[B_{k+1}^{0,f(1,m)} + D_{k+1}^{0,f(1,m)}] + \exp[B_{k+1}^{1,f(1,m)} + D_{k+1}^{1,f(1,m)}]] \quad \text{Eq. 10}$$

The reverse state metric can be simplified based on Eq. 9 and Eq. 10. In Case input i=0 at $k^{th}$ stage with m state, the reverse state metric $B_k^{0,m}$ can be calculated as below.

At a first step, in case an input i=0 at $k^{th}$ stage with m state, a reverse state metric $B_{k+1}^{0,f(0,m)}$ and branch metric $D^{k+1,0,f}_{(0,m)}$ in a $(k+1)^{th}$ stage with f(0,m) state and j=0 which is connected though a next branch, are added.

At a second step, in case an input i=0 at $k^{th}$ stage with m state reverse state metric $B_{k+1}^{1,f(0,m)}$ and branch metric $D^{k+1,f(0,m)}$ in a a $(K+1)^{th}$ stage with f(0,m) state and j=1, which is connected though a next branch, are added.

At a third step, an exponential function is applied to a result value at the first step and to a result value at the second step. Two results of applying the exponential function are added.

At a fourth step, a reverse state metric $B_k^{0,m}$ can be calculated by getting natural log value of a result of the third step.

With same method, a reverse state metric $B_k^{1,m}$ can be calculated in case an input i=1 at $k^{th}$ stage with m state as below.

At a first step, in case an input i=1 at $k^{th}$ stage with m state, a reverse state metric $B_{k+1}^{0,f(1,m)}$ and branch metric $D^{k+1,0,f}_{(1,m)}$ in a $(k+1)^{th}$ stage with f(1,m) state and j=0, which is connected though a next branch, are added.

At a second step, in case an input i=1 at $k^{th}$ state with m state, a reverse state metric $B_{k+1}^{1,f(1,m)}$ and branch metric $D^{k+1,1,f(1,m)}$ in a $(k+1)^{th}$ stage with f(1,m) state and j=1, which is connected though a nest branch, are added.

At a third step, an exponential function is applied to a result value at the first step and to a result value at the second step. Two results of applying the exponential function are added.

At a fourth step, a reverse state metric $B_k^{1,m}$ can be calculated by getting natural log value of a result of the third step.

In the meantime, states of $k^{th}$ stage and states of $(k+1)^{th}$ stage are connected each others as a butterfly form in a trellis diagram, which depicting state shifting according to a structure of a recursive systematic code coder of the turbo decoder. As mentioned above, the reverse state metric at $k^{th}$ stage can be calculated by a branch metric and a reverse state metric at $(k+1)^{th}$ stage. At this point, two states at $k^{th}$ stage connected as a butterfly form are connected two states at $(k+1)^{th}$ stage. In other word, two states are same as other two states. Therefore, if two states are calculated then another two states do not need to be calculated. Therefore, the calculation steps for the reverse state metric can be reduced in half comparing with calculation steps of the algorithm the article by Pietrobon in 1995.

The reverse state metric calculation method of the present invention can be implemented to a turbo code, which is selected as a standard of 3GPP in IMT-2000.

Figure 1:
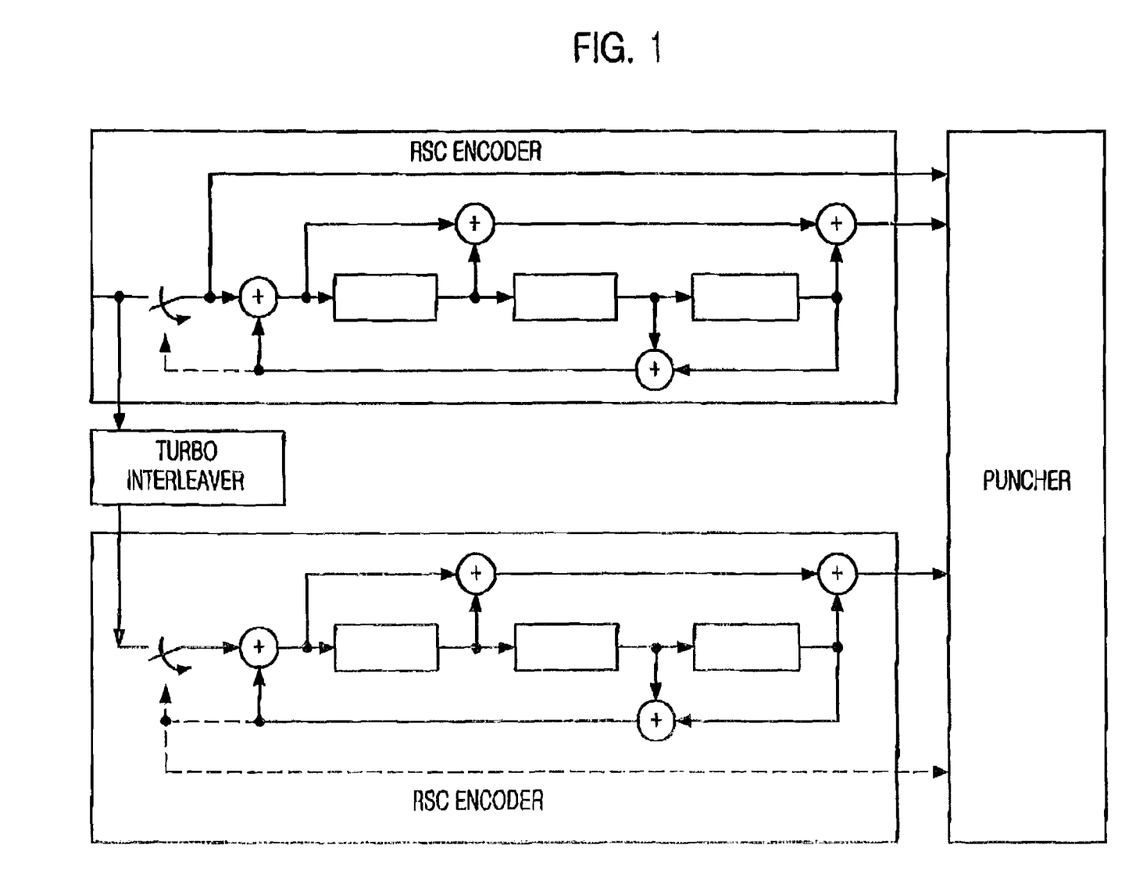
FIG. 1 is a schematic block diagram of conventional turbo decoder.

FIG. 1 is a schematic diagram of conventional turbo decoder, which is selected as a standard of 3GPP in IMT-2000.

As shown in FIG. 1, a constant length of the turbo decoder is 4 and a code rate (R) of the turbo decoder is ½. A generator polynomial of the turbo decoder can be expressed as follows:

$$G(D) = \left[1, \frac{n(D)}{d(D)}\right] \quad \text{Eq. 11}$$

wherein, $d(D)=1+D^2+D^3$ and $n(D)=1+D+D^3$.

Figure 2:
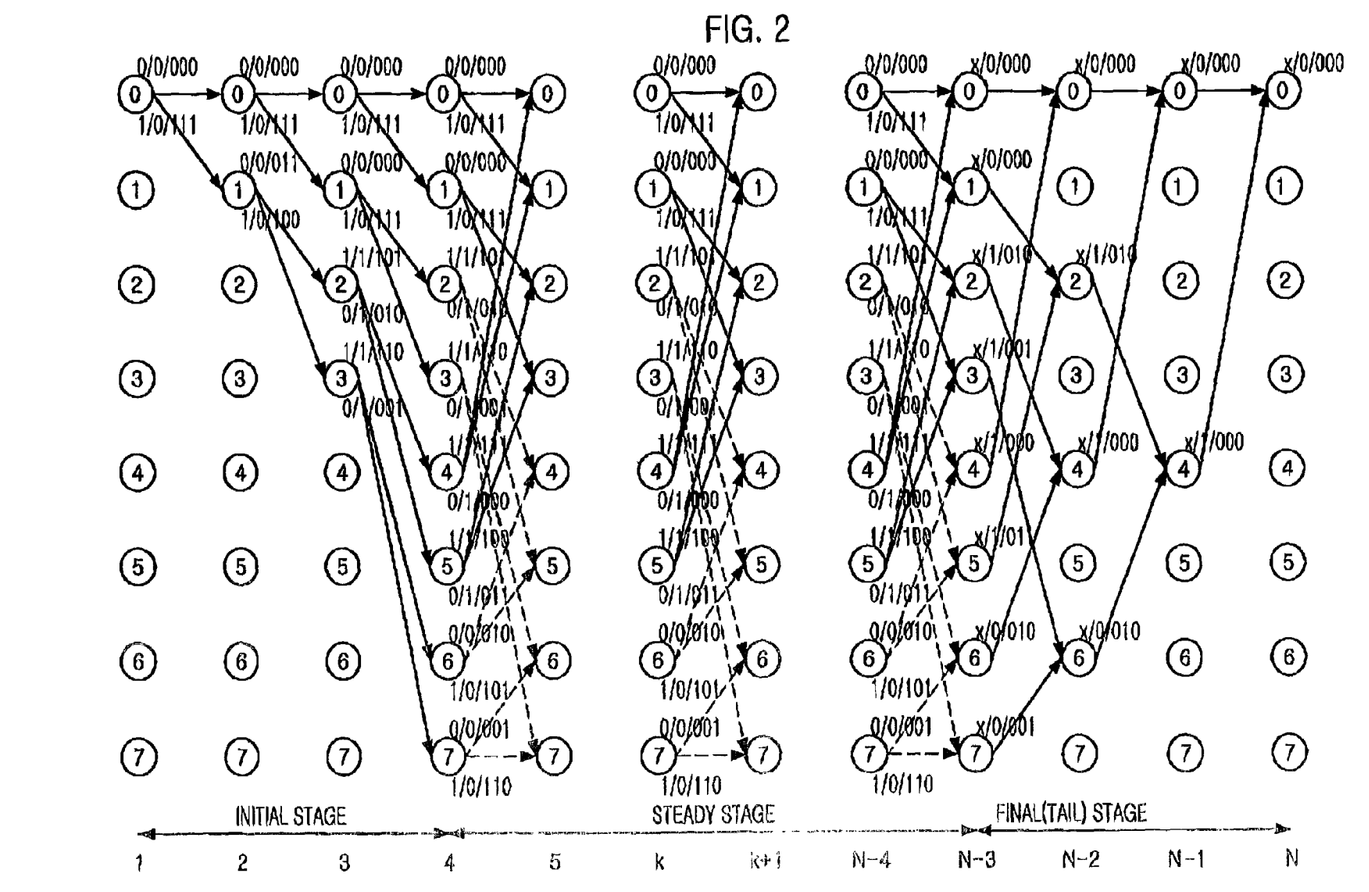
FIG. 2 is a trellis diagram depicting states transition according to a conventional recursive systematic code coder.

FIG. 2 is a trellis diagram depicting states shifting according to a conventional recursive systematic code coder. As shown in FIG. 2, a state pair (0,1) of $(k+1)^{th}$ stage can be predicted by a state pair (0,4) at $k^{th}$ stage.

Figure 3:
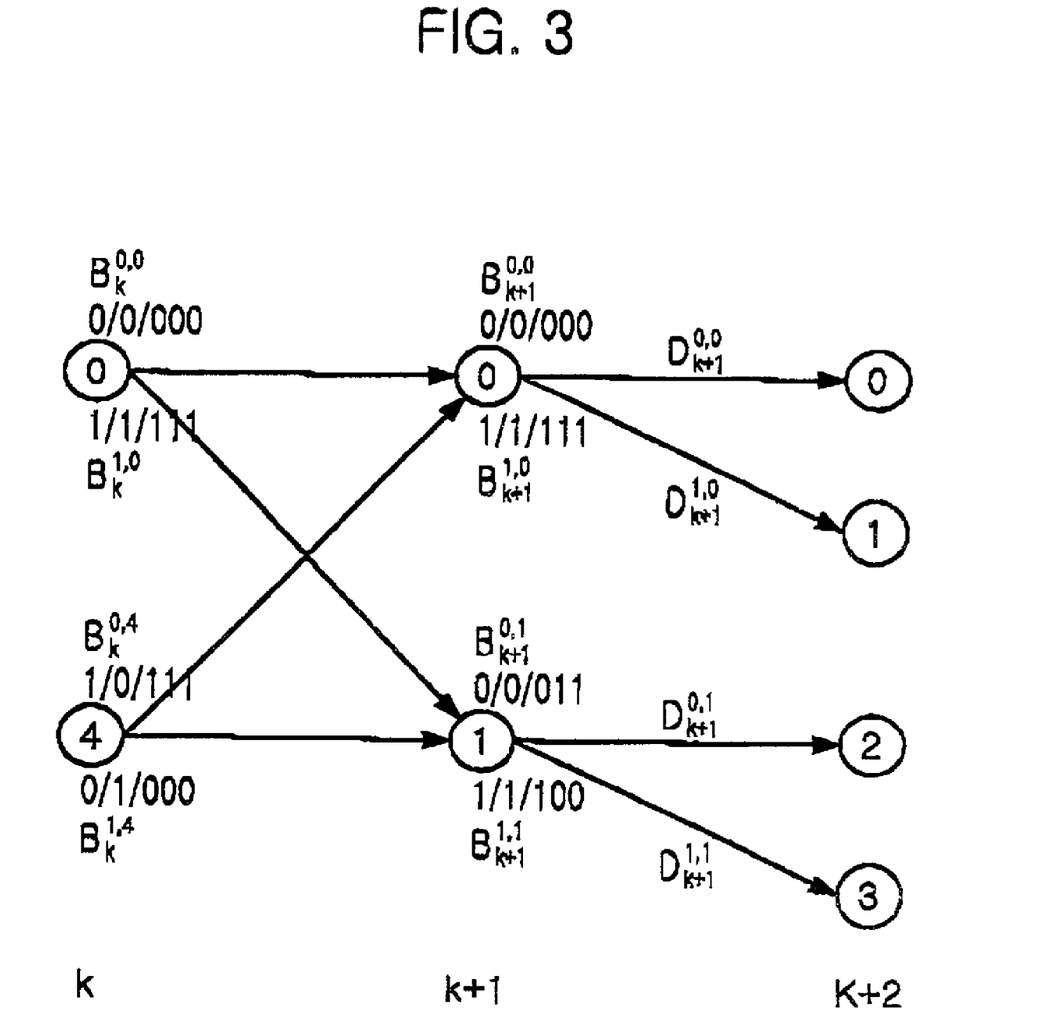
FIG. 3 is a trellis diagram for calculating a reverse state metric of a turbo decoder in accordance with a preferred embodiment of the present invention.

FIG. 3 is a trellis diagram for calculating a reverse state metric of a turbo decoder in accordance with a preferred embodiment of the present invention.

As show in FIG. 3, since the reverse state metric with a state 0 and 4 at a $k^{th}$ stage connected in a butterfly form, a reverse state metric according to $k^{th}$ stage can be expressed as follows:

$$B_k^{0,0} = \ln[\exp[B_{k+1}^{0,0} + D_{k+1}^{0,0}] + \exp[B_{k+1}^{1,0} + D_{k+1}^{1,0}]] \quad \text{Eq. 12}$$

$$B_k^{1,0} = \ln[\exp[B_{k+1}^{0,1} + D_{k+1}^{0,1}] + \exp[B_{k+1}^{1,1} + D_{k+1}^{1,1}]]$$

$$B_k^{1,4} = \ln[\exp[B_{k+1}^{0,0} + D_{k+1}^{0,0}] + \exp[B_{k+1}^{1,0} + D_{k+1}^{1,0}]]$$

$$B_k^{0,4} = \ln[\exp[B_{k+1}^{0,1} + D_{k+1}^{0,1}] + \exp[B_{k+1}^{1,1} + D_{k+1}^{1,1}]]$$

Referring to the Eq. 12, $B_k^{0,0}$ is same as $B_k^{1,4}$ and $B_k^{1,0}$ is same as $B_k^{0,4}$. Therefore, the Eq. 12 can be expressed as a below equation based on input 0.

$$B_k^{0,0} = B_k^{1,4} \quad \text{Eq. 13}$$

$$B_k^{1,0} = B_k^{0,4}$$

Therefore, state pairs (1,5), (2,6) and (3,7) can be calculated as follows:

$$\text{input } i = 0/\text{state } m = 0 : B_k^{0,0} = \ln[\exp[B_{k+1}^{0,0} + D_{k+1}^{0,0}] + \exp[B_{k+1}^{1,0} + D_{k+1}^{1,0}]] \quad \text{Eq. 14}$$

$$\text{input } i = 0/\text{state } m = 1 : B_k^{0,1} = \ln[\exp[B_{k+1}^{0,2} + D_{k+1}^{0,2}] + \exp[B_{k+1}^{1,2} + D_{k+1}^{1,2}]]$$

$$\text{input } i = 0/\text{state } m = 2 : B_k^{0,2} = \ln[\exp[B_{k+1}^{0,5} + D_{k+1}^{0,5}] + \exp[B_{k+1}^{1,5} + D_{k+1}^{1,5}]]$$

$$\text{input } i = 0/\text{state } m = 3 : B_k^{0,3} = \ln[\exp[B_{k+1}^{0,7} + D_{k+1}^{0,7}] + \exp[B_{k+1}^{1,7} + D_{k+1}^{1,7}]]$$

$$\text{input } i = 0/\text{state } m = 4 : B_k^{0,4} = \ln[\exp[B_{k+1}^{0,1} + D_{k+1}^{0,1}] + \exp[B_{k+1}^{1,1} + D_{k+1}^{1,1}]]$$

$$\text{input } i = 0/\text{state } m = 5 : B_k^{0,5} = \ln[\exp[B_{k+1}^{0,3} + D_{k+1}^{0,3}] + \exp[B_{k+1}^{1,3} + D_{k+1}^{1,3}]]$$

$$\text{input } i = 0/\text{state } m = 6 : B_k^{0,6} = \ln[\exp[B_{k+1}^{0,4} + D_{k+1}^{0,4}] + \exp[B_{k+1}^{1,4} + D_{k+1}^{1,4}]]$$

$$\text{input } i = 0/\text{state } m = 7 : B_k^{0,7} = \ln[\exp[B_{k+1}^{0,6} + D_{k+1}^{0,6}] + \exp[B_{k+1}^{1,6} + D_{k+1}^{1,6}]]$$

$$\text{input } i = 1/\text{state } m = 0 : B_k^{1,0} = \ln[\exp[B_{k+1}^{0,1} + D_{k+1}^{0,1}] + \exp[B_{k+1}^{1,1} + D_{k+1}^{1,1}]] = B_k^{0,4}$$

$$\text{input } i = 1/\text{state } m = 1 : B_k^{1,1} = \ln[\exp[B_{k+1}^{0,3} + D_{k+1}^{0,3}] + \exp[B_{k+1}^{1,3} + D_{k+1}^{1,3}]] = B_k^{0,5}$$

$$\text{input } i = 1/\text{state } m = 2 : B_k^{1,2} = \ln[\exp[B_{k+1}^{0,4} + D_{k+1}^{0,4}] + \exp[B_{k+1}^{1,4} + D_{k+1}^{1,4}]] = B_k^{0,6}$$

$$\text{input } i = 1/\text{state } m = 3 : B_k^{1,3} = \ln[\exp[B_{k+1}^{0,6} + D_{k+1}^{0,6}] + \exp[B_{k+1}^{1,6} + D_{k+1}^{1,6}]] = B_k^{0,7}$$

$$\text{input } i = 1/\text{state } m = 4 : B_k^{1,4} = \ln[\exp[B_{k+1}^{0,0} + D_{k+1}^{0,0}] + \exp[B_{k+1}^{1,0} + D_{k+1}^{1,0}]] = B_k^{0,0}$$

$$\text{input } i = 1/\text{state } m = 5 : B_k^{1,5} = \ln[\exp[B_{k+1}^{0,2} + D_{k+1}^{0,2}] + \exp[B_{k+1}^{1,2} + D_{k+1}^{1,2}]] = B_k^{0,1}$$

$$\text{input } i = 1/\text{state } m = 6 : B_k^{1,6} = \ln[\exp[B_{k+1}^{0,5} + D_{k+1}^{0,5}] + \exp[B_{k+1}^{1,5} + D_{k+1}^{1,5}]] = B_k^{0,2}$$

$$\text{input } i = 1/\text{state } m = 7 : B_k^{1,7} = \ln[\exp[B_{k+1}^{0,7} + D_{k+1}^{0,7}] + \exp[B_{k+1}^{1,7} + D_{k+1}^{1,7}]] = B_k^{0,3}$$

Therefore, at one stage, 16 pairs of state metric are need to be calculated but there are identical reverse state metric so only 8 pairs of state metric need to be calculated.

In detail, in case a constant length k is 4 with a stage, 16 calculation steps will be reduced to 8 calculation steps, and also a memory space for a reverse state metric will be reduced in half.

Therefore, the calculation equation for the reverse state metric at a stage can be expressed as below equation. In other word, the calculation for the reverse state metric is performed in case an input i is 0 and in case an input i is 1, the reverse state metric can be gained by a function s with a state m.

$$B_k^{1,m} = B_k^{0,s(m)} \quad \text{Eq. 15}$$

$$B_k^{0,m} = B_k^{1,s(m)}$$

Inhere, a function s(m) changes m by complementing a Most Significant Bit (MSB) of binary number of m. In other word, a value of m can be gained by reversing the most significant bit (MSB) of the binary number of m. For example, if k=4 then there are 8 different s(m)s and it can be expressed by 3-bit binary number. In this case, if m=0 in decimal number then it is "000" in binary number, then s(m) is "100" in binary, which is a binary number of complement of the most significant bit of the "000". "100" binary number is 4 in a decimal number. The reverse state metric can be calculated simply by complementing the most significant bit of state m in case i=0.

For calculating a reverse state metric can be expressed as follows:

$$B_k^{0,m} = \underset{j=0}{\overset{1}{E}} \left( B_{k+1}^{j,f(0,m)} + D_{k+1}^{j,f(0,m)} \right) \quad \text{Eq. 16}$$

$$= \ln\left[\exp\left[B_{k+1}^{0,f(0,m)} + D_{k+1}^{0,f(0,m)}\right] + \exp\left[B_{k+1}^{1,f(0,m)} + D_{k+1}^{1,f(0,m)}\right]\right]$$

-continued $$= \ln\left[\exp\left[B_{k+1}^{0,f(m)} + D_{k+1}^{0,f(m)}\right] + \exp\left[B_{k+1}^{1,f(m)} + D_{k+1}^{1,f(m)}\right]\right]$$

In the Eq. 16, f(0,m) only includes a case of input 0 so f(0,m) can be expressed as f(m).

The Eq. 16 can be expressed a blow equation since each terms are identical except state m in case input i is 1 or 0.

$$B_k^{1,f(m)} = B_k^{0,s(f(m))} \quad \text{Eq. 17}$$

The Eq. 17 can be transformed as follows:

$$B_k^{0,m} = \ln[\exp[B_{k+1}^{0,f(m)} + D_{k+1}^{0,f(m)}] + \exp[B_{k+1}^{0,s(f(m))} + D_{k+1}^{1,f(m)}]] \quad \text{Eq. 18}$$

The Eq. 18 expresses the reverse state metric in case input i=0, therefore 0 can be removed from the Eq. 18.

$$B_k^m = \ln[\exp[B_{k+1}^{f(m)} + D_{k+1}^{0,f(m)}] + \exp[B_{k+1}^{s(f(m))} + D_{k+1}^{1,f(m)}]] \quad \text{Eq. 19}$$

The Eq. 19 can be transformed to an equation for using a function E.

A Function F(j,m) can be defined as below.
F(j,m)=f(m) for j=0
=s(f(m)) for j=1

In other word, at (k+1)$^{th}$ stage, if input j is 0 then a reverse state metric is a reverse state metric of f(m) and if input j is 1 then a reverse state metric is a reverse state metric of the function s of f(m).

Therefore, a final equation for the reverse state metric can be simplified as follows:

$$B_k^m = \underset{j=0}{\overset{1}{E}} \left( B_{k+1}^{F(j,m)} + D_{k+1}^{j,f(m)} \right) \quad \text{Eq. 20}$$

A calculation method of log likelihood ratio (LLR) by using a reverse state metric in accordance with the present invention will be described as below.

An algorithm of log likelihood ratio (LLR) in accordance with the present invention is derived from an algorithm introduced by Pietrobon in 1995.

In other word, $B_k^{0,m}$ is a reverse state metric in case an input i is 0. According to the present invention, equations are not distinguished by the input i so $B_k^{0,m}$ can be expressed as $B_k^m$. $B_k^{1,m}$ is a reverse state metric in case the input i is 1. It also can be expressed as $B_k^{s(m)}$. Therefore, the log likelihood ratio can be expressed as a below equation.

$$L_k = \mathop{E}_{m=0}^{2^v-1}(A_k^{1,m} + B_k^{s(m)}) - \mathop{E}_{m=0}^{2^v-1}(A_k^{0,m} + B_k^m) \quad \text{Eq. 21}$$

Inhere, S(m) is binary number of m with a most significant bit complemented.

In a meantime, if a calculation method of an algorithm introduced by Pietrobon in 1995 is used for the log likelihood ratio, then a forward state metric and a reverse state metric need to be implemented separately since a structural difference between the log likelihood ratio in accordance with the present invention and an calculation method of a reverse state metric. Therefore, the Eq. 21 needs to be changed to that the function E needs to be calculated after calculating the reverse state metric and an addition operation instead of calculating addition operation after calculating a function E. New equation is derived by changing an order of calculation method of the forward state metric for modifying the Eq. 21.

The forward state metric at a first stage in the Eq. 2 can be expressed as follows:

$$A_k^{1,m} = D_1^{i,m} + \mathop{E}_{j=0}^{1} A_0^{j,b(j,m)} \quad \text{Eq. 22}$$

wherein, $\mathop{E}_{j=0}^{1} A_0^{j,b(j,m)}$ is 0 since it does not have any value at previous stage. And the forward state metric at a second stage is expressed as a following equation.

$$A_2^{1,m} = D_2^{i,m} + \mathop{E}_{j=0}^{1} A_1^{j,b(j,m)} \quad \text{Eq. 23}$$

If a result of the Eq. 23 is $A_1^m$ then the second term is expressed as a following equation.

$$A_1^m = \mathop{E}_{j=0}^{1} A_1^{j,b(j,m)} \quad \text{Eq. 24}$$

Therefore, a below equation can be derived by implementing the Eq. 24 at $k^{th}$ stage.

$$A_k^m = \mathop{E}_{j=0}^{1} A_k^{j,b(j,m)} \quad \text{Eq. 25}$$

Therefore, the Eq. 25 will be transformed to a below equation.

$$A_k^{i,m} = D_k^{i,m} + A_{k-1}^m \quad \text{Eq. 26}$$

Also the Eq. 26 can be transformed to below equation.

$$A_k^m = \mathop{E}_{j=0}^{1} A_k^{j,b(j,m)} = \mathop{E}_{j=0}^{1}\left(D_k^{j,b(j,m)} + A_{k-1}^{b(j,m)}\right) \quad \text{Eq. 27}$$

Therefore, $A_k^m$ can be expressed as following equations.

$$A_k^m = \mathop{E}_{j=0}^{1}\left(D_k^{j,b(j,m)} + A_{k-1}^{b(j,m)}\right) \quad \text{Eq. 28}$$

$$A_k^{j,b(j,m)} = D_k^{j,b(j,m)} + A_{k-1}^{b(j,m)} \quad \text{Eq. 29}$$

As shown in equations, calculation of the forward state metric is progressed by using $A_k^m$ and in case of the log likelihood ratio, $A_k^{i,m}$ is used before a function E is applied in $A_k^m$ calculation.

Final equations used in MAP algorithm of a turbo decoder are described as below.

$$D_k^{i,m} = \frac{2}{\sigma^2}(x_k i + y_k Y_k^{i,m}) \quad \text{Eq. 30}$$

$$A_k^m = \mathop{E}_{j=0}^{1}\left(D_k^{j,b(j,m)} + A_{k-1}^{b(j,m)}\right) \quad \text{Eq. 31}$$

$$B_k^m = \mathop{E}_{j=0}^{1}\left(B_{k+1}^{F(j,m)} + D_{k+1}^{j,f(m)}\right) \quad \text{Eq. 32}$$

$$L_k = \mathop{E}_{m=0}^{2^v-1}(A_k^{1,m} + B_k^{s(m)}) - \mathop{E}_{m=0}^{2^v-1}(A_k^{0,m} + B_k^m) \quad \text{[Eq. 33]}$$

Also, below equations can be derived by Eq. 29 to Eq. 33 implementing to a binary log MAP.

$$D_k^{i,m} = (\log_2 e)\frac{2}{\sigma^2}(x_k i + y_k Y_k^{i,m}) \quad \text{Eq. 34}$$

$$A_k^m = \mathop{2}_{j=0}^{1}\left(D_k^{j,b(j,m)} + A_{k-1}^{b(j,m)}\right) \quad \text{Eq. 35}$$

$$B_k^m = \mathop{2}_{j=0}^{1}\left(B_{k+1}^{F(j,m)} + D_{k+1}^{j,f(m)}\right) \quad \text{Eq. 36}$$

$$L_k = \mathop{2}_{m=0}^{2^v-1}(A_k^{1,m} + B_k^{s(m)}) - \mathop{2}_{m=0}^{2^v-1}(A_k^{0,m} + B_k^m) \quad \text{Eq. 37}$$

According to above-mentioned equations, calculation steps of the reverse state metric are reduced by half. The equation for the log likelihood ratio also is modified and the log likelihood ratio calculation does not use branch metric. Additionally, the forward state metric calculation is modified for using same structure of the reverse state metric calculation in accordance with the present invention.

Figure 4:
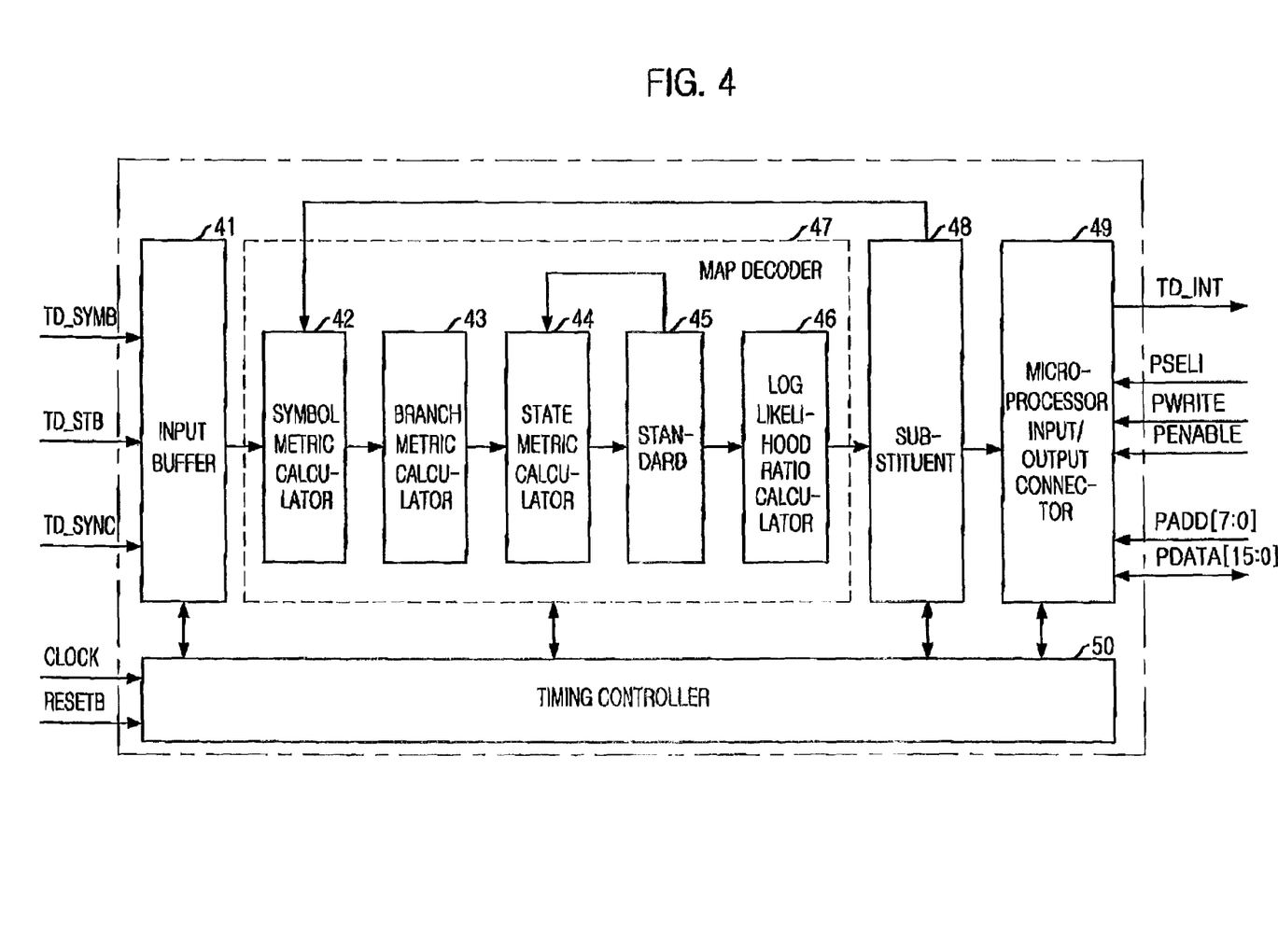
FIG. 4 is a block diagram of a turbo decoder in accordance with the preferred embodiment of the present invention.

FIG. 4 is a block diagram of a turbo decoder in accordance with the preferred embodiment of the present invention.

As shown in FIG. 4, the turbo decoder is composed of an input buffer 41, a MAP decoder 47, a substituent 48, a microprocessor input/output connector 49 and a timing controller 50.

The input buffer 41 stores a transmitted symbol. The MAP decoder 47 performs a binary log MAP (Log2MAP) algorithm. The substituent 48 performs interleaving and di-interleaving step. The microprocessor input/output connector transmits a result of decoding to a microprocessor. The timing controller 50 controls a timing of elements of the turbo decoder.

Additionally, the MAP decoder 47 includes a symbol metric calculator 42, a branch metric calculator 43, a state metric calculator 44, a standard 45 and a log likelihood ratio calculator 46.

The symbol metric calculator 42 receives symbols from the input buffer 41 and transmits symbols to the branch metric calculator 43. The branch metric calculator 43 calculates a branch metric with received symbols area provides the calculated branch metric to the state metric calculator 44. The state metric calculator 44 calculates a reverse metric with received branch metric and saves calculating results to a memory. The state metric calculator 44 also calculates a forward state metric by using the branch metric and transmits the forward state metric to the log likelihood ratio calculator 46 through the standard unit 45.

The log likelihood ratio calculator 46 calculates a log likelihood ratio by receiving the forward state metric and reading the reverse state metric. The calculated log likelihood ratio is stored to the memory as interleaved or di-interleaved by the substituent 48.

In case two MAP decoders are combined in the turbo decoder, the substituent 48 transmits extrinsic information gained at decoding process to the symbol metric calculator 42 as interleaved. Therefore, the symbol metric calculator 42 calculates the symbol metric based on symbols from the input buffer 41 and the extrinsic information from the substituent 48. The symbol metric calculator 42 performs repeatedly the above-mentioned branch metric calculation and state metric calculation.

Generally, the turbo decoder contains two MAP decoders so two MAP decoding processes are performed in one turbo decoding process.

The timing controller 50 controls a timing of operations of elements including a buffering operation in the input buffer 41, a decoding operation in the MAP decoder 47, an interleaving/di-interleaving operation and operations of the microprocessor input/output connector 49.

Figure 5A:
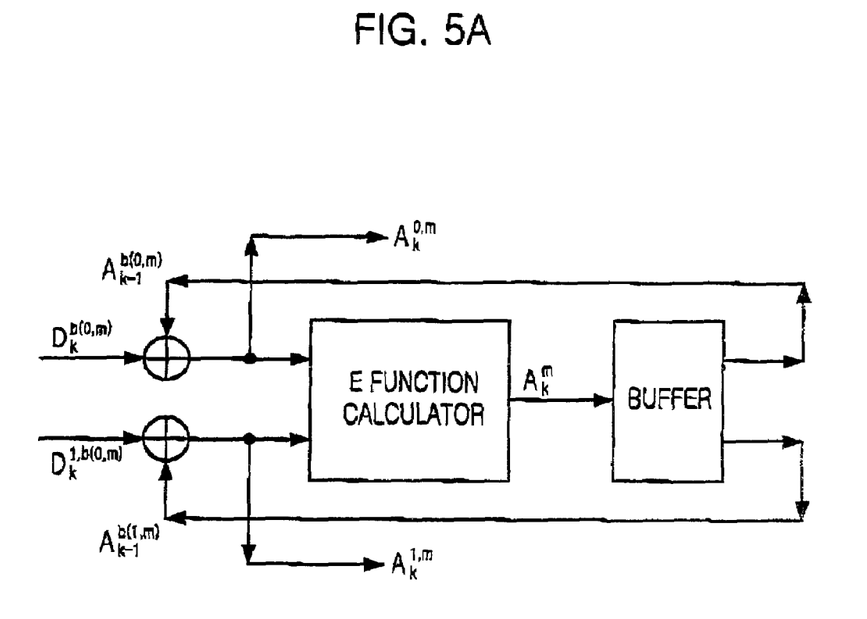
FIGS. 5A and 5B are diagrams illustrating state metric calculators in the turbo decoder in accordance with the preferred embodiment of the present invention.
Figure 5B:
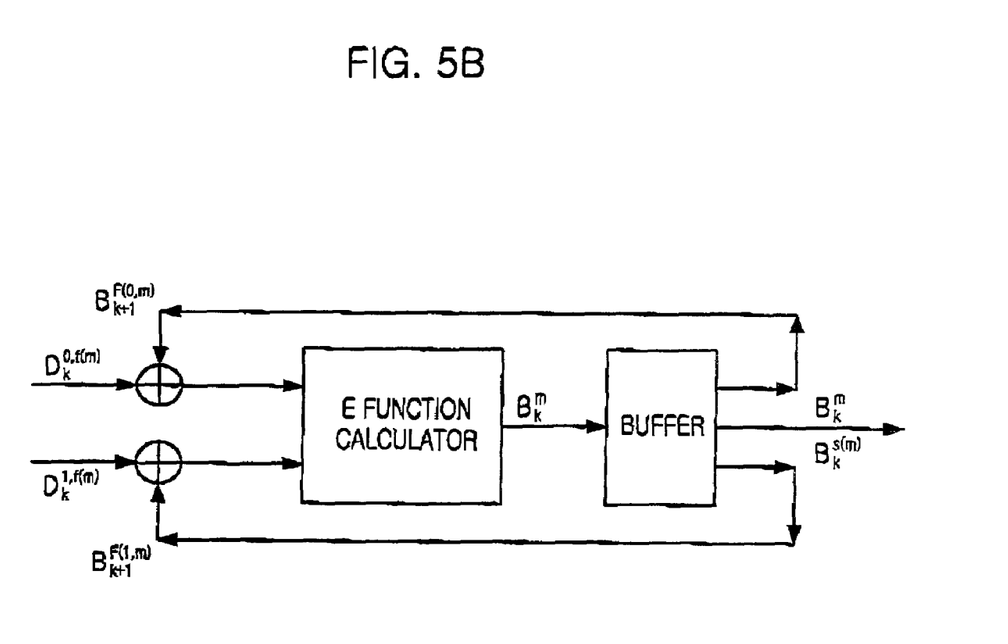

FIGS. 5a and 5b are diagrams illustrating state metric calculators in the turbo decoder in accordance with the preferred embodiment of the present invention.

The state metric calculator includes a forward state metric calculator and a reverse state metric calculator. As shown in FIG. 5a, the forward state metric calculator includes a function E calculator and a buffer and gives an operation result as the Eq. 31. As shown in FIG. 5b, the reverse state metric calculator also includes a function E calculator and a buffer and gives an operation result as the Eq. 32.

Figure 6:
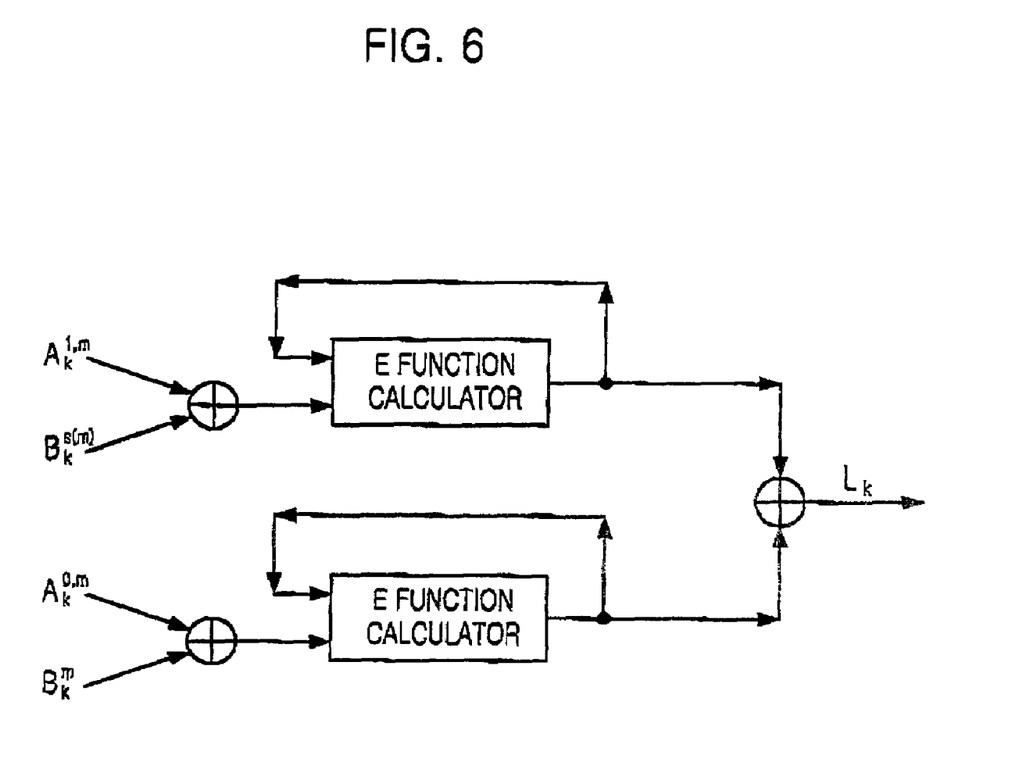
FIG. 6 is a diagram of the log likelihood calculator in the turbo decoder in accordance with the preferred embodiment of the present invention.

FIG. 6 is a diagram of the log likelihood calculator in the turbo decoder in accordance with the preferred embodiment of the present invention.

As shown in FIG. 6, the log likelihood calculator includes two function E calculators and a subtracter and gives a operation result as the Eq. 33.

Figure 7:
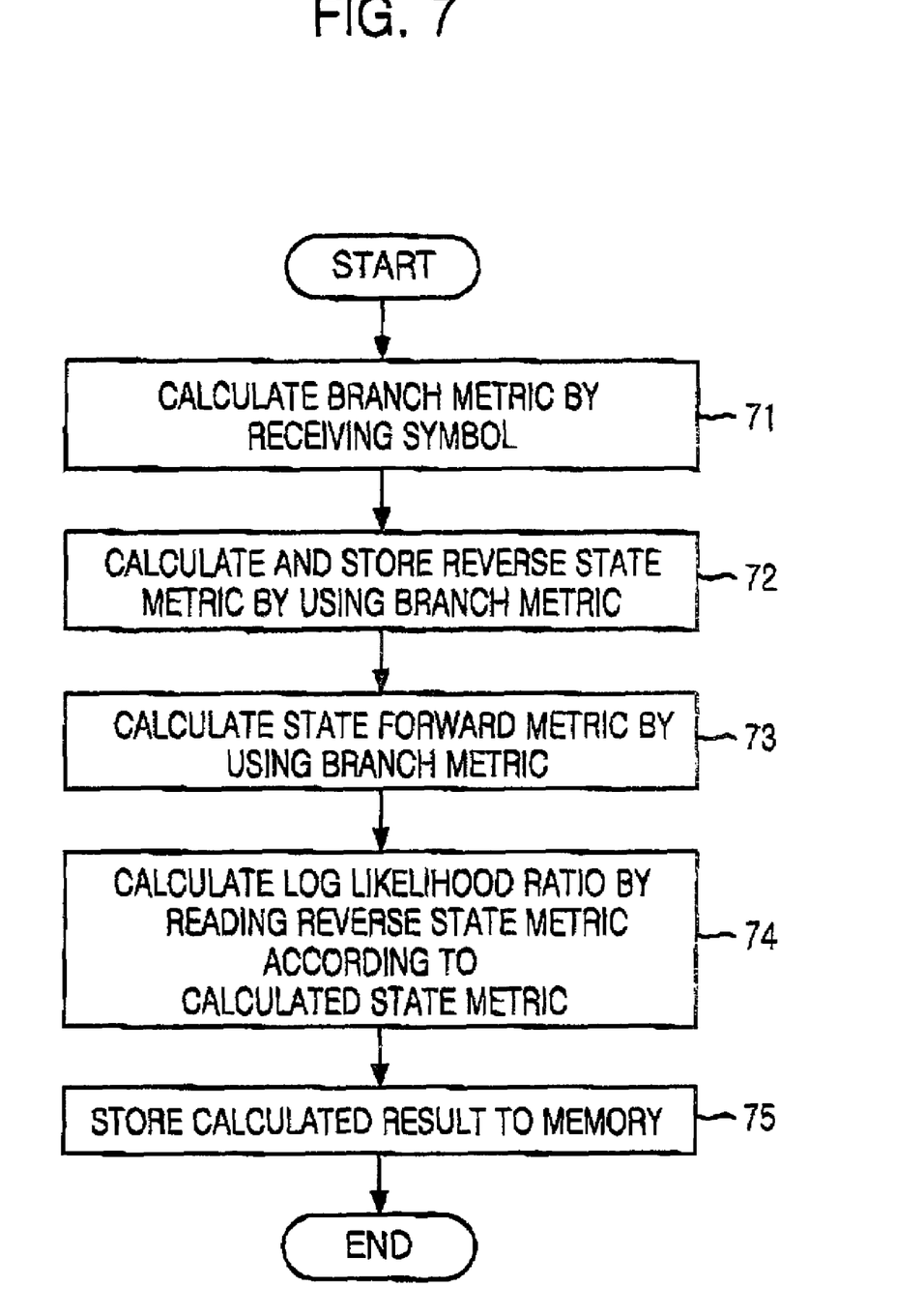
FIG. 7 is a flowchart for illustrating a calculation method of the turbo decoder in accordance with the present invention.

FIG. 7 is a flowchart illustrating a calculation method of the turbo decoder in accordance with the preferred embodiment of the present invention.

As shown in FIG. 7, at a step 71, the branch metric calculator 43 calculates a branch metric by using transmitted symbols from the input buffer. The symbol metric calculator and the branch metric is transmitted to a state metric calculator 41.

At a step 72, the state metric calculator 44 calculates a reverse state metric and stores the calculated reverse state metric in a memory.

At a step 73, the state metric calculator 44 also calculates a forward state metric by using the branch metric and transmits the calculated forward state metric to the log likelihood ratio calculator 46.

At a step 74, the log likelihood ratio calculator 46 calculates a log likelihood ratio (LLR) by reading the reverse state metric in the memory according to the forward state metric.

At a step 75, the calculated log likelihood ratio is stored in the memory as interleaved or di-interleaved.

Above-mentioned operation steps of the present invention can be implemented as a program and the program can be saved in recode medium such as a CD-ROM, a RAM, a ROM, a floppy disk, a hard disk and a magnetic optic disk.

Above-mentioned turbo decoder in accordance with the preferred embodiment of the present invention can reduce calculation steps. In calculating the reverse state metric, the calculation steps may be reduced in half by deriving the reverse state metric in case of input i is 1 from the calculated reverse state metric in case of input i is 0. In calculating the log likelihood ratio, the calculation steps may be reduced since the branch metric isn't necessary to calculate.

Additionally, the present invention can be applied to a natural log MAP, a binary log MAP, a SubLogMAP and a MaxLogMAP, therefore, in case the present invention is implemented to a hardware device, the present invention can reduce complexity of the hardware device.

While the present invention has been described with respect to certain preferred embodiments, it will be apparent to those skilled in the art that various changes and modifications may be made without departing from the scope of the invention as defined in the following claims.

What is claimed is:

1. An apparatus comprising:
   a turbo decoder having a state metric, the turbo decoder including:
      branch metric calculation means for calculating a branch metric by receiving symbols through an input buffer;
      state metric calculation means for calculating a reverse state metric by using the calculated branch metric at said branch metric calculation means, storing the reverse state metric in a memory, calculating a forward state metric; and
   log likelihood ratio calculator for calculating a log likelihood ratio result by receiving the forward state metric from said state metric calculation means and reading the reverse state metric saved at a memory in said state metric calculation means,
   wherein the log likelihood ratio result $L_k$ is produced by computing a function $$\mathop{E}_{m=0}^{2^v-1}(A_k^{1,m} + B_k^{s(m)}) - \mathop{E}_{m=0}^{2^v-1}(A_k^{0,m} + B_k^m)$$

by the log likelihood ratio calculator, wherein m is a state of a trellis diagram; k is a stage; s(m) is a function a number complemented a Most Significant Bit(MSB) of binary number of m;

$$\underset{j=0}{\overset{1}{E}}$$

is a function defined as $$\underset{j=0}{\overset{1}{E}} A_k^j = A_k^0 \; E \; A_k^1 = \log_e(e^{A_k^0} + e^{A_k^1});$$

j is a $(k-1)^{th}$ input for a reverse state metric; $A_k^{1,m}$ is a $k^{th}$ forward state metric with state m and input 1; $B_k^{s(m)}$ is a $k^{th}$ reverse state metric with state s(m); $A_k^{0,m}$ is a $k^{th}$ forward state metric with state m and input 0 and $B_k^m$ is a $k^{th}$ reverse state metric with state m, and the log likelihood ratio is stored in a memory of the turbo decoder.

2. The apparatus of claim 1, wherein said state metric calculation means includes:
reverse state metric calculation means for calculating a reverse state metric in case an input i is 0 according to states of the branch metric; and
forward state metric calculation means for calculating a forward state metric in case an input i is 0 or in case the input i is 1 according to states of the branch metric.

3. The turbo decoder having a state metric as recited in claim 1, wherein the log likelihood ratio $L_k$ is calculated by using an equation $$\underset{m=0}{\overset{2^v-1}{2}} (A_k^{1,m} + B_k^{s(m)}) - \underset{m=0}{\overset{2^v-1}{2}} (A_k^{0,m} + B_k^m)$$

wherein m is a state of a trellis diagram; k is a stage; j is a $(k-1)^{th}$ input for a reverse state metric; s(m) is a function provides binary number of m with a most significant bit complemented;

$$\underset{j=0}{\overset{1}{2}}$$

is a function defined as $$\underset{j=0}{\overset{1}{2}} A_k^j = A_k^0 2 \; A_k^1 = \log_2(2^{A_k^0} + 2^{A_k^1}); A_k^{1,m}$$

is a $k^{th}$ forward state metric with state m and input 1; $B_k^{s(m)}$ is a $k^{th}$ reverse state metric with state s(m); $A_k^{0,m}$ is a $k^{th}$ forward state metric with state m and input 0 and $B_k^m$ is a $k^{th}$ reverse state metric with state m.

4. A method comprising:
calculating a branch metric by receiving symbols;
calculating a reverse state metric in case an input i is 0 by using the calculated branch metric and saving the calculated reverse state metric in a memory;
calculating a forward state metric in case an input i is 0 or in case the input i is 1 by using the calculated branch metric;
calculating a log likelihood ratio by using the forward state metric and the reverse state metric; and
storing the log likelihood ratio,
wherein the log likelihood ratio result $L_k$ is produced by computing a function $$\underset{m=0}{\overset{2^v-1}{E}} (A_k^{1,m} + B_k^{s(m)}) - \underset{m=0}{\overset{2^v-1}{E}} (A_k^{0,m} + B_k^m)$$

by a first calculator, wherein m is a state of a trellis diagram; s(m) is a function provides a number complemented a Most Significant Bit (MSB) of binary number of m;

$$\underset{j=0}{\overset{1}{E}}$$

is a function defined as $$\underset{j=0}{\overset{1}{E}} A_k^j = A_k^0 \; E \; A_k^1 = \log_e(e^{A_k^0} + e^{A_k^1});$$

is a $(k-1)^{th}$ input for a reverse state metric; k is a stage; $A_k^{1,m}$ is a $k^{th}$ forward state metric with state m and input 1; $B_k^{s(m)}$ is a $k^{th}$ reverse state metric with state s(m); $A_k^{0,m}$ is a $k^{th}$ forward state metric with state m and input 0 and $B_k^m$ is a $k^{th}$ reverse state metric with state m.

5. The method of claim 4, wherein the reverse state metric result $B_k^m$, which is $k^{th}$ reverse state metric with state m, is produced by computing a function $$\underset{j=0}{\overset{1}{E}} \left( B_{k+1}^{F(j,m)} + D_{k+1}^{j,f(m)} \right)$$

by a second calculator, wherein m is a state of a trellis diagram; k is a stage; j is a $(k-1)^{th}$ input for a reverse state metric; f(m) is the state of $(k+1)^{th}$ stage related to the state m of $k^{th}$ stage; F(j,m) is a function defined as F(j,m)=f(m) for j=0 and F(j,m)=s(f(m)) for j=1; s(m) is a function provides a number complemented for a Most Significant Bit (MSB) of binary number of m;

$$\underset{j=0}{\overset{1}{E}}$$

is a function defined as $$\underset{j=0}{\overset{1}{E}} A_k^j = A_k^0 \; E \; A_k^1 = \log_e(e^{A_k^0} + e^{A_k^1}); B_{k+1}^{F(j,m)}$$

is a $(k+1)^{th}$ reverse state metric with state F(j,m) and $D_{k+1}^{j,f(m)}$ is $(k+1)^{th}$ branch metric with state m and $(k+1)^{th}$ input.

6. The method of claim 4, wherein the forward state metric result $A_k^m$, which is $k^{th}$ forward state metric with state m, is produced by computing a function $$\mathop{E}_{j=0}^{1} (D_k^{j,b(j,m)} + A_{k-1}^{b(j,m)})$$

by a second calculator, wherein m is a state of a trellis diagram; k is a stage; b(j,m) is the reverse state of the $(k-1)^{th}$ stage; j is a $(k+1)^{th}$ input for a reverse state metric;

$$\mathop{E}_{j=0}^{1}$$

is a function defined as $$\mathop{E}_{j=0}^{1} A_k^j = A_k^0 \; E \; A_k^1 = \log_e(e^{A_k^0} + e^{A_k^1}); A_{k-1}^{b(j,m)}$$

is a $(k-1)^{th}$ forward state metric with state b(j,m) and $D^{j,b(j,m)}$ is $k^{th}$ branch metric with state b(j,m).

7. The method of claim 4, wherein the reverse state metric result $B_k^m$, which is $k^{th}$ reverse state metric with state m, is produced by computing a function $$\mathop{2}_{j=0}^{1} (B_{k+1}^{F(j,m)} + D_{k+1}^{j,f(m)})$$

by a second calculator, wherein m is a state of a trellis diagram; k is a stage; j is a $(k-1)^{th}$ input for a reverse state metric; f(m) is a state of $(k+1)^{th}$ stage related to $k^{th}$ state with state m; F(j,m) is a function defined as F(j,m)=f(m) for j=0 and F(j,m)=s(f(m)) for j=1; s(m) is a function provides a number complemented for a Most Significant Bit (MSB) of binary number of m;

$$\mathop{2}_{j=0}^{1}$$

is a function defined as $$\mathop{2}_{j=0}^{1} A_k^j = A_k^0 \; 2 \; A_k^1 = \log_2(2^{A_k^0} + e^{A_k^1}); B_{k+1}^{F(j,m)}$$

is a $(k+1)^{th}$ reverse state metric with state F(j,m) and $D^{k+1,j,f(m)}$ is $(k+1)^{th}$ branch metric with state m and $(k+1)^{th}$ input.

8. The method of claim 4, wherein the forward state metric result $A_k^m$, which is $k^{th}$ forward state metric with state m, is produced by computing a function $$\mathop{2}_{j=0}^{1} (D_k^{jb(j,m)} + A_{k-1}^{b(j,m)})$$

by a second calculator, wherein m is a state of a trellis diagram; k is a stage; b(j,m) is a $(k-1)^{th}$ reverse state; j is a $(k+1)^{th}$ input for a reverse state metric;

$$\mathop{2}_{j=0}^{1}$$

is a function defined as $$\mathop{2}_{j=0}^{1} A_k^j = A_k^0 \; 2 \; A_k^1 = \log_2(2^{A_k^0} + 2^{A_k^1}); A_{k-1}^{b(j,m)}$$

is a $(k-1)^{th}$ forward state metric with state b(j,m) and $D^{j,b(j,m)}$ is $k^{th}$ branch metric with state b(j,m).

9. A method comprising:
calculating a branch metric by receiving symbols;
calculating a reverse state metric in case an input i is 0 by using the calculated branch metric and saving the calculated reverse state metric in a memory;
calculating a forward state metric in case an input i is 0 or in case the input i is 1 by using the calculated branch metric;
calculating a log likelihood ratio by using the forward state metric and the reverse state metric; and
storing the log likelihood ratio,
wherein the log likelihood ratio result $L_k$ is produced by computing a function $$\mathop{2}_{m=0}^{2^v-1} (A_k^{1,m} + B_k^{s(m)}) - \mathop{2}_{m=0}^{2^v-1} (A_k^{0,m} + B_k^m)$$

by a calculator, wherein m is a state of a trellis diagram; k is a stage; s(m) is a function provides a number complemented for a Most Significant Bit (MSB) of binary number of m;

$$\mathop{2}_{j=0}^{1}$$

is a function defined as $$\mathop{2}_{j=0}^{1} A_k^j = A_k^0 \; 2 \; A_k^1 = \log_2(2^{A_k^0} + 2^{A_k^1}); A_k^{l,m}$$

is a $k^{th}$ forward state metric with state m and input 1; j is a $(k-1)^{th}$ input for a reverse state metric; $B_k^{s(m)}$ is a $k^{th}$ reverse state metric with state s(m); $A_k^{0,m}$ is a $k^{th}$ forward state metric with state m and input 0 and $B_k^m$ is a $k^{th}$ reverse state metric with state m.

10. A computer-readable recording medium storing instructions for executing a calculation method implemented to a turbo decoder, comprising functions of:
calculating a branch metric by receiving symbols;
calculating a reverse state metric in case an input i is 0 by using the calculated branch metric and saving the calculated reverse state metric in a memory;
calculating a forward state metric in case an input i is 0 or in case the input i is 1 by using the calculated branch metric;

calculating a log likelihood ratio by using the forward state metric and the reverse state metric; and storing the log likelihood ratio, wherein the log likelihood ratio $L_k$ is calculated by using an equation $$\underset{m=0}{\overset{2^v-1}{E}}(A_k^{1,m} + B_k^{s(m)}) - \underset{m=0}{\overset{2^v-1}{E}}(A_k^{0,m} + B_k^m)$$

wherein m is a state of a trellis diagram; k is a stage; j is a $(k-1)^{th}$ input for a reverse state metric; s(m) is a function provides binary number of m with a most significant bit complemented;

$$\underset{j=0}{\overset{1}{E}}$$

is a function defined as $$\underset{j=0}{\overset{1}{E}} A_k^j = A_k^0 E A_k^1 = \log_e(e^{A_k^0} + e^{A_k^1}); A_k^{1,m}$$

is a $k^{th}$ forward state metric with state m and input 1; $B_k^{s(m)}$ is a $k^{th}$ reverse state metric with state s(m); $A_k^{0,m}$ is a $k^{th}$ forward state metric with state m and input 0 and $B_k^m$ is a $k^{th}$ reverse state metric with state m.

11. The computer-readable recording medium as recited in claim 10, wherein the log likelihood ratio $L_k$ is calculated by using an equation $$\underset{m=0}{\overset{2^v-1}{2}}(A_k^{1,m} + B_k^{s(m)}) - \underset{m=0}{\overset{2^v-1}{2}}(A_k^{0,m} + B_k^m)$$

wherein m is a state of a trellis diagram; k is a stage; j is a $(k-1)^{th}$ input for a reverse state metric; s(m) is a function provides binary number of m with a most significant bit complemented;

$$\underset{j=0}{\overset{1}{2}}$$

is a function defined as $$\underset{j=0}{\overset{1}{2}} A_k^j = A_k^0 2 A_k^1 = \log_2(2^{A_k^0} + 2^{A_k^1}); A_k^{1,m}$$

is a $k^{th}$ forward state metric with state m and input 1; $B_k^{s(m)}$ is a $k^{th}$ reverse state metric with state s(m); $A_k^{0,m}$ is a $k^{th}$ forward state metric with state m and input 0 and $B_k^m$ is a $k^{th}$ reverse state metric with state m.

* * * * *